Figure 2:
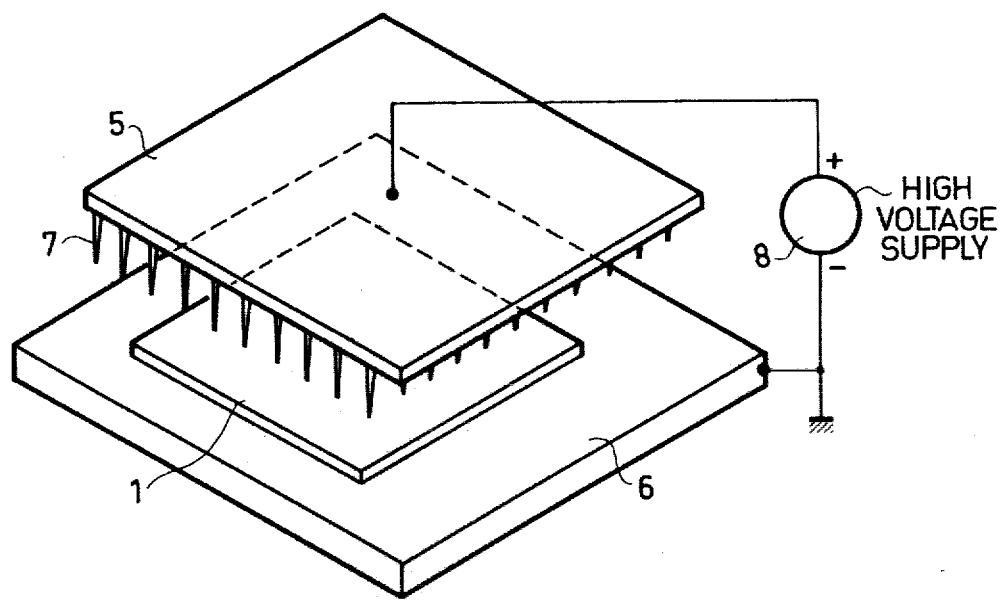

United States Patent [19]

Micheron

[11] 4,327,153

[45] Apr. 27, 1982

[54] COMPOSITE PIEZOELECTRIC MATERIAL IN THE FORM OF A FILM AND A METHOD OF FABRICATION OF SAID MATERIAL

[75] Inventor: François Micheron, Paris, France

[73] Assignee: Thomson-CSF, Paris, France

[21] Appl. No.: 186,845

[22] Filed: Sep. 15, 1980

[30] Foreign Application Priority Data

Sep. 14, 1979 [FR] France ............................... 79 22984

[51] Int. Cl.³ .............................................. B32B 27/00
[52] U.S. Cl. .................................... 428/421; 428/230; 428/246; 428/260; 428/476.6; 427/100
[58] Field of Search ............ 428/421, 246, 230, 476.6, 428/260; 427/100

[56] References Cited

U.S. PATENT DOCUMENTS

| | | |
|---|---|---|
| 4,208,462 | 6/1980 | Dauphin et al. ................. 428/421 X |
| 4,215,177 | 7/1980 | Strassel ............................ 428/421 X |
| 4,221,757 | 9/1980 | Strassel ............................ 428/421 X |
| 4,241,128 | 12/1980 | Wang .............................. 428/421 X |
| 4,268,653 | 5/1981 | Uchidoi et al. ................. 428/421 X |

FOREIGN PATENT DOCUMENTS 51-1085499 7/1976 Japan ................................... 428/421

*Primary Examiner*—Mayer Weinblatt
*Attorney, Agent, or Firm*—Oblon, Fisher, Spivak, McClelland & Maier

[57] ABSTRACT

The composite material is obtained by coating a fabric with a polymer. Coating is performed either in the cold state by dipping the fabric in a solution of polymer dissolved in a solvent or in the hot state by dipping in a molten polymer. The film of composite material thus obtained is then endowed with piezoelectric properties by subjecting it to an intense electric field.

8 Claims, 5 Drawing Figures

COMPOSITE PIEZOELECTRIC MATERIAL IN THE FORM OF A FILM AND A METHOD OF FABRICATION OF SAID MATERIAL

This invention relates to a composite piezoelectric material and to a method of fabrication for obtaining said material.

Many different materials exhibit piezoelectric properties or are capable of producing such effects after a suitable treatment. Piezoelectric materials also have pyroelectric properties. Examples of this class are the polarized ferroelectric ceramics or monocrystalline quartz. Materials which have made a more recent appearance are the piezoelectric polymers which are employed in the form of flat films metallized on both faces. These films may or may not have been oriented mechanically but are in all cases polarized by application of an intense electric field (of the order of 1 MV/cm) at a temperature higher than or equal to room temperature. By virtue of this treatment, films of polymeric material acquire pyroelectric and piezoelectric properties which permit their use as transducers. Among the applications of flat films can be mentioned pressure or displacement transducers (microphone, hydrophone, stress gage and so on) and temperature sensors (pyroelectric transducer for detection of intruders, for infrared imagery). It has been proposed to employ these materials after thermoforming or molding in suitable shapes for the fabrication of loudspeaker or microphone diaphragms. Transducer devices of this type are described, for example, in French Patent Application No. 77 34 589 filed on Nov. 17, 1977 in the name of the present applicant.

Among the polymers which are well-suited to these applications, the following may be mentioned by way of indication: polyvinylidene fluoride ($PVF_2$), polyvinyl chloride (PVC), polyvinyl fluoride (PVF) as well as copolymers such as polytetrafluoroethylene-polyvinylidene fluoride ($PTFE-PVF_2$). Flat films of these polymers are usually obtained by inflated-tube extrusion, calendering, pressing or solvent evaporation. It is difficult, however, to obtain films of large size.

Each type of piezoelectric material has its own characteristic mechanical compliance and dielectric permittivity, with the result that these two parameters are determined by the choice of material. In some applications and especially in the case of hydrophones, it is an advantage to make use of piezoelectric materials in which the coefficients just mentioned comply with preestablished standards and can be adopted independently of each other. This is not always feasible in the case of homogeneous materials, with the result that composite piezoelectric materials have consequently been proposed. It is possible, for example, to associate piezoelectric ceramic materials with plastic materials.

In order to meet these requirements and to overcome the disadvantages attached to the materials employed in the prior art, this invention proposes a composite material which is capable of exhibiting piezoelectric properties as well as a method of fabrication after suitable treatment of the material. This material consists of a polymer-impregnated fabric. This method permits generally economical production of piezoelectric and pyroelectric films of large size in which certain electrical and mechanical coefficients can be determined independently beforehand.

The invention is therefore directed to a composite material produced in the form of a film and capable of exhibiting piezoelectric properties by induction of electrical anisotrophy as a result of a suitable treatment. The material is primarily distinguished by the fact that it is reinforced with at least one layer of polymer-impregnated fabric in at least one region of said material.

The invention is further directed to a method of fabrication of a material, said method being primarily distinguished by the fact that it includes a step consisting of coating at least one layer of fabric with a polymer.

Figure 1:
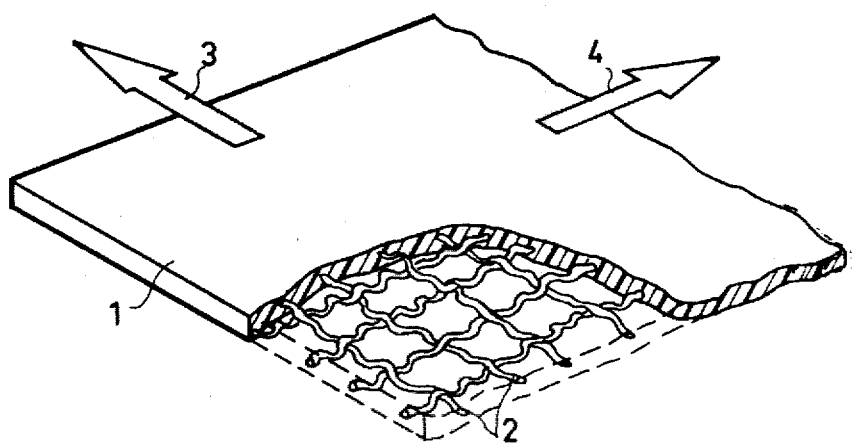
Figure 3:
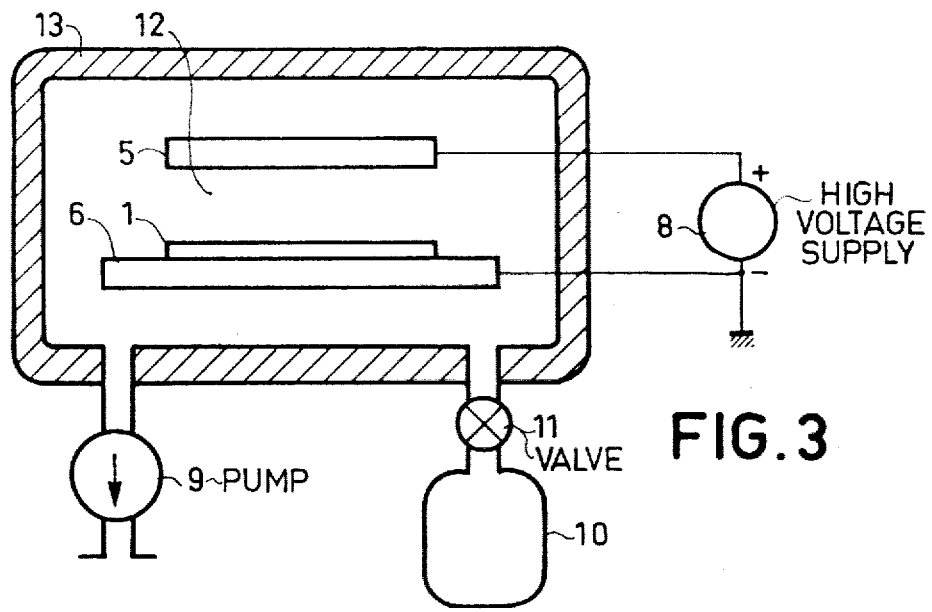
Figure 4:
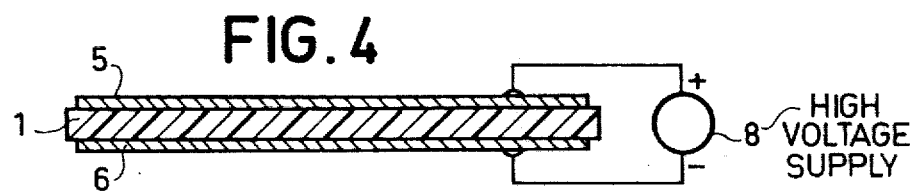
Figure 5:
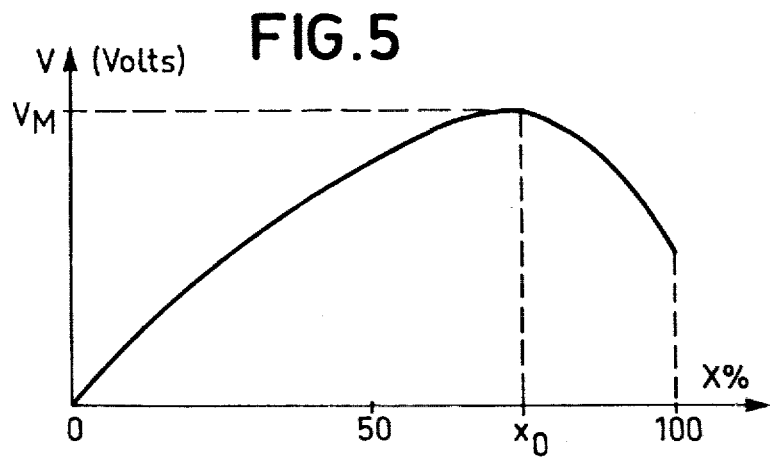

These and other features of the invention will be more apparent upon consideration of the following description and accompanying drawings, wherein:

FIG. 1 illustrates one example of composite piezoelectric and pyroelectric material in accordance with the invention;

FIGS. 2 to 4 each illustrate diagrammatically one step of the method of fabrication of a material of this type;

FIG. 5 is an explanatory diagram characterizing the voltage response of a composite piezoelectric material which is subjected to external stresses.

Before describing the composite material produced in accordance with the invention and the method of fabrication of this material, it will first prove useful to recall the main properties of polymeric materials. These materials can be classed in two principal groups, namely on the one hand the amorphous polymers and on the other hand the semicrystalline polymers. One example of a semicrystalline polymer is $PVF_2$. As is well known, the structure of polyvinylidene fluoride ($PVF_2$) is composed of spheroidal crystalline zones contained in an amorphous phase. The macroscopic mechanical properties are those of an isotropic substance. This polymer has distinct crystalline forms: $\alpha$ and $\beta$. The $\alpha$ form is obtained from the polymer which is melted at a temperature of the order of 170° C. or after evaporation, at a temperature above approximately 80° C., of $PVF_2$ in solution in a solvent which can consist of dimethylformamide (DMF), for example. The molecular chains are coiled in a helix and have an arrangement of atoms of carbon, hydrogen and fluorine of $PVF_2$ such that the electric dipole moments combine with each other along the chains. The $\beta$ form is less stable than the $\alpha$ form and is characterized by a zigzag chain and by electric dipole moments whose effects are added. The $\beta$ form is obtained by evaporating a solution of $PVF_2$ in a solvent (DMF, for example) at a temperature below approximately 70° C. If consideration is given to a small-volume element of the polymeric material, said element is therefore made up of a certain number of chains having a highly polar solid phase I ($\beta$ phase). If the polymeric material has not been subjected to any stress after solidification, it is endowed with good mechanical stability and may be considered from a macroscopic standpoint as electrically isotropic since it has not been electrically polarized. It is also known that, in order to establish piezoelectric and pyroelectric properties in polyvinylidene fluoride as well as in the other polar polymers, these materials have to be subjected to substantial stretching (300 to 500%) with a view to converting the non-polar phase II to the polar phase I. This stretching process induces a mechanical anisotrophy. In order to produce the electrical anisotrophy required for the appearance of pyroelectric and piezoelectric effects, the material is subjected to an intense electric field having a direction essentially at right angles to the principal planes of the sheet of polymeric material. If the sheet of polymeric material which has been treated in this manner is fitted with electrodes on each face, the assembly forms a transducer element which produces a proportional voltage when heated or when subjected to an external stress, for example to a pressure in a direction at right angles to the plane of the sheet. Conversely, a voltage applied between the electrodes produces proportional mechanical deformations, again in the direction at right angles to the plane of the sheet. In the case of some polymeric materials, it is possible to omit the mechanical stretching stage and to induce an anisotrophy in the material solely by electrical means and at a temperature above 80° C. This method forms the subject of Patent Application No. 79 00 200 filed on Jan. 4, 1979 in the name of the present applicant. For example, $PVF_2$ in the non-polar phase is thus made pseudo-polar ($\alpha_p$ phase). This method must also be employed for the amorphous polymers such as polyvinyl chloride (PVC) and polyvinyl fluoride (PVF).

As recalled earlier, these polymers in the form of films are employed for the fabrication of transducers of different types. However, it is difficult to obtain films of polymeric material having large surface areas by means of the methods which have also been recalled in the foregoing.

In complete contrast, the present invention proposes a composite material and a method of fabrication which makes it possible to obtain large-area films of said material. With this objective, a fabric is impregnated with polymeric material. The fabric forms a flat support and impregnation of this latter with a polymeric material makes it possible to obtain a film having the same surface area as that of the fabric employed. Impregnation or coating of the fabric can be effected in two different approaches: in the first approach, the fabric is impregnated by dipping in a bath of molten polymer, usually at a temperature within the range of 170° to 180° C.; in the second approach, the impregnation can be performed at room temperature by employing a solution of a polymer in a solvent such as dimethylformamide or cyclohexanone, for example.

In the case of semicrystalline polymers such as polyvinylidene fluoride ($PVF_2$) or copolymers obtained by association of said polymer with polytetrafluoroethylene (PTFE), for example, it is necessary to ensure that the crystalline phase is in a polar phase. This is the case with $PVF_2$-PTFE as soon as the concentration of PTFE exceeds 3 to 4%. Similarly, $PVF_2$ in solution in dimethylformamide is in the $\beta$ polar phase when the temperature of evaporation of the solvent is lower than 70° C. When the $PVF_2$ is obtained from a molten bath, the $\beta$ polar phase is obtained by stretching to between 300 and 500% at a temperature which is lower than or equal to 70° C. It is also possible to obtain an $\alpha_p$ pseudo-polar phase simply by applying a very intense electric field (higher than 1 MV/cm) at a temperature higher than or equal to room temperature, in accordance with the method described in the French Patent Application No. 79 00 200 cited earlier. This method is also employed for amorphous polymers.

The choice of fabric will be determined on the one hand by the approach adopted for impregnation and on the other hand by the mechanical and electrical properties with which it is desired to endow the composite material obtained by means of the method according to the invention.

As far as the first point is concerned, impregnation of a fabric in accordance with the first approach limits the choice of the fabric to those which are capable of withstanding high temperatures, thus excluding in particular certain synthetic fabrics. With regard to impregnation in accordance with the second approach, this process excludes all fabrics having a composition which would be incompatible with the solvent employed.

The treatment which is intended to impart piezoelectric and pyroelectric properties to the composite materials thus obtained also governs the choice of the supporting fabric. In point of fact the majority of fabrics are not capable of being stretched up to values of the order of 300 to 500% which are necessary in order to obtain a mechanically oriented phase. The method adopted in this case consists in inducing piezoelectric and pyroelectric properties solely by applying an intense electric field in a direction perpendicular to the plane of the fabric, this method being described in the French Patent Application No. 79 00 200 cited earlier.

However, certain fabrics lend themselves to stretching on account of their elastic texture. By way of example and not in any limiting sense, the so-called "stretch fabrics" fall into this category. Stretching capability can also be enhanced by subjecting the threads of the fabric to a special treatment so that they assume a coiled state and are then capable of being stretched to a considerable extent.

One example of a fabric of this type is illustrated diagrammatically in FIG. 1 and designated by the reference numeral 2. This fabric is subsequently impregnated with a polymer 1 in order to form the composite material according to the invention. The film can then be stretched in any direction parallel to the plane of said film, for example in the directions 3 or 4 illustrated in the figure. It should be recalled that the semicrystalline materials such as $PVF_2$ are capable of acquiring a $\beta$-type polar phase as a result of stretching.

By way of example, the invention has been tested in two similar cases which differ only in the nature of the fabric employed. The two fabrics are respectively:

a natural silk having a mesh spacing of approximately 100 μm;

a synthetic polyamide fabric having a mesh spacing within the range of 200 to 300 μm.

These two fabrics have been coated with a saturated solution of $PVF_2$ in dimethylformamide. The coating operation was performed by dipping the fabric in the solution. The surface tension of the solution was sufficient to ensure that the solution filled the meshes in both cases. Evaporation was obtained at room temperature over a period of 24 hours. It was then observed that only about 95% of the meshes of the wide-mesh polyamide fabric were filled with polymer whereas the defects found in the silk fabric amounted to less than 1%. The two samples were again dipped in the same solution and dried under the same conditions. Filling of the meshes was then complete in both cases.

Once the composite material has been obtained, an electric polarization step must be performed in all cases in order to ensure that these materials acquire the desired pyroelectric and piezoelectric properties by means of this treatment. In a first approach, this electric polarization can be carried out by the Corona method as illustrated in FIG. 2. To this end, the impregnated fabric 1 is stretched over a metallic surface 6 which is connected to the negative pole of a source 8 of direct-current high voltage. Provision is made for an array of metallic pins 7 disposed on a square lattice, namely in lines and columns having a spacing of 2 cm. Said array of pins is placed at approximately 2 cm above the impregnated fabric 1 and connected to the positive pole of the source 8 by means of a metallic electrode 5. The voltage employed is of the order of 15 KV and applied during five minutes at room temperature.

In a variant of this approach which is illustrated in FIG. 3, the elements of FIG. 2, namely the electrodes 5 and 6 and the film 1 of composite material are placed within an enclosure 13 in which the pressure is reduced by means of a vacuum pump 9. A reservoir 10 of neutral gas fitted with a regulating valve 11 makes it possible to obtain discharge conditions such as to form a plasma between the electrode 5 and the film within the region 12. A gas electrode is thus formed in this region.

In a second approach, the two principal faces of the film 1 are metallized so as to form two electrodes 5 and 6. By way of example, a silver lacquer may be employed for this purpose and applied on said two principal faces. As in the previous instance, the electrodes 5 and 6 are connected to the positive and negative poles of a direct-current voltage source 8.

The polarization mentioned above can also be carried out in accordance with different approaches which have been omitted from the drawings. For example, at least one face of the film of composite material can be placed in contact with a conductive liquid electrode or, alternatively, the film can be placed between two flat electrodes applied under pressure.

The film of composite material in accordance with the invention can be utilized in the fabrication of different types of transducer such as a pressure transducer, for example. In a process carried out by way of illustration of this application, the samples described in the foregoing were metallized on both faces by means of a silver lacquer applied in the cold state and the piezoelectric coefficients were then measured. The film was placed on a flat surface, pressed down by means of a known weight and the electric charge developed between the electrodes was then measured. The measured piezoelectric coefficient was: $d \simeq 8 \times 10^{-13}$ $C.N^{-1}$.

Although lower than the piezoelectric coefficient of $PVF_2$ stretched and polarized in the hot state (maximum piezoelectric coefficient), the order of magnitude is nevertheless sufficient to ensure that the composite material obtained by means of the method in accordance with the invention can be usefully employed as a piezoelectric transducer.

As has already been recalled in the foregoing, one particularly advantageous example of application of composite materials lies in the use of this type of material for the fabrication of hydrophones.

The invention is not limited to the practical examples which have just been described. Thus the composite material in accordance with the invention extends to all fields of application of piezoelectricity and of pyroelectricity. Particular applications worthy of mention are electroacoustic devices, ultrasonic transmitters and receivers employed in underwater acoustics, infrared radiation sensors, ink-jet writing devices, devices for igniting explosive charges, electric relays and electromechanical filters. By way of non-limitative example, a description of a certain number of these devices was given in French Patent Application No. 77 34 589 filed on Nov. 17, 1977.

FIG. 5 shows, for example, the curve of the measured voltage between the two electrodes of such a device versus the ratio: polymer/fabric. The curve presents a maximum for $x_o$.

Finally, the film of composite material in accordance with the invention can consist of more than one layer of fabrics or may be reinforced with fabric only in certain predetermined regions whilst the remaining portion of the film consists only of polymeric material.

What is claimed is:

1. A composite material endowed with piezoelectric properties by induction of electrical anisotropy, wherein said material is reinforced with at least one layer of polymer-impregnated fabric in at least one region of said material, said polymer being selected from the group consisting of polyvinylidene fluoride, polyvinyl chloride, polyvinyl fluoride, and copolymers thereof, and said electrical anisotropy having been induced by subjecting the material to a polarizing electric field normal to the faces of the material.

2. The composite material according to claim 1, wherein the material is additionally subjected to a mechanical stretching operation.

3. The composite material according to claim 1, wherein the polarizing electric field comprises a corona discharge.

4. The composite material according to claim 1, wherein the polarizing electric field comprises a plasma discharge.

5. The composite material according to claim 1, wherein the polymer is polyvinylidene fluoride.

6. The composite material according to claim 1, wherein the polymer is polyvinyl chloride.

7. The composite material according to claim 1, wherein the polymer is polyvinyl fluoride.

8. The composite material according to claim 1, wherein the polymer is polytetrafluoroethylene-polyvinylidene fluoride copolymer.

* * * * *